United States Patent
Gupta et al.

(10) Patent No.: US 11,870,422 B2
(45) Date of Patent: Jan. 9, 2024

(54) BULK ACOUSTIC WAVE RESONATOR FILTERS WITH INTEGRATED CAPACITORS

(71) Applicant: Akoustis, Inc., Huntersville, NC (US)

(72) Inventors: Saurabh Gupta, Mooresville, NC (US); Zhiqiang Bi, Mooresville, NC (US); Emad Mehdizadeh, Charlotte, NC (US); Dae Ho Kim, Cornelius, NC (US); Pinal Patel, Charlotte, NC (US)

(73) Assignee: Akoustis, Inc., Huntersville, NC (US)

( * ) Notice: Subject to any disclaimer, the term of this patent is extended or adjusted under 35 U.S.C. 154(b) by 349 days.

(21) Appl. No.: 17/110,675

(22) Filed: Dec. 3, 2020

(65) Prior Publication Data

US 2022/0182039 A1    Jun. 9, 2022

(51) Int. Cl.
*H03H 9/54* (2006.01)
*H03H 3/02* (2006.01)

(52) U.S. Cl.
CPC ............. *H03H 9/542* (2013.01); *H03H 3/02* (2013.01)

(58) Field of Classification Search
CPC ...................................................... H03H 9/542
See application file for complete search history.

(56) References Cited

U.S. PATENT DOCUMENTS

| | | | |
|---|---|---|---|
| 7,830,227 B1 * | 11/2010 | Chang ................ | H01H 59/0009 333/132 |
| 10,230,350 B2 | 3/2019 | Hey-Shipton | |
| 2001/0048352 A1 * | 12/2001 | Klee .................. | H03H 9/02094 333/191 |
| 2004/0130411 A1 | 7/2004 | Beaudin et al. | |
| 2005/0218754 A1 * | 10/2005 | Yokoyama ............. | H03H 9/564 310/328 |
| 2006/0028298 A1 | 2/2006 | Nakamura et al. | |
| 2008/0116999 A1 | 5/2008 | Park et al. | |
| 2008/0157897 A1 | 7/2008 | Tilmans et al. | |
| 2011/0316649 A1 * | 12/2011 | Link .................. | H03H 9/02157 333/133 |

(Continued)

OTHER PUBLICATIONS

International Search Report and Written Opinion, PCT/US2021/054928, dated Jan. 18, 2022; 10 pages.

(Continued)

*Primary Examiner* — Samuel S Outten
(74) *Attorney, Agent, or Firm* — Stanek Lemon Crouse & Meeks, P.A.

(57) ABSTRACT

A device includes a piezoelectric layer on a substrate and including a portion included in an acoustic resonator, a first conductive layer on the piezoelectric layer and including a first electrode of the acoustic resonator on a first side of resonator portion of the piezoelectric layer, and a second conductive layer on the piezoelectric layer and including a second electrode of the acoustic resonator on a second side of the resonator portion of the piezoelectric layer. An insulating layer is disposed on the second conductive layer and an interconnection metal layer is electrically connected to the second conductive layer or the first conductive layer and has a portion extending onto the insulating layer and overlapping a portion of the second conductive layer to provide a capacitor electrode of a capacitor coupled to the first electrode and/or the second electrode.

17 Claims, 10 Drawing Sheets

(56) References Cited

U.S. PATENT DOCUMENTS

| | | |
|---|---|---|
| 2015/0221442 A1* | 8/2015 | Link .................... H03H 9/0542 |
| | | 361/301.4 |
| 2017/0163242 A1* | 6/2017 | Miyamoto ............. H03H 9/542 |
| 2017/0338799 A1 | 11/2017 | Ruby et al. |
| 2018/0294792 A1 | 10/2018 | Lee et al. |
| 2019/0036592 A1 | 1/2019 | Shealy et al. |
| 2020/0219861 A1* | 7/2020 | Kamgaing ........... H03H 9/0561 |
| 2020/0228096 A1 | 7/2020 | Shen et al. |

OTHER PUBLICATIONS

International Search Report and Written Opinion, PCT/US2020/040985, dated Sep. 30, 2020; 3 pages.

\* cited by examiner

BULK ACOUSTIC WAVE RESONATOR FILTERS WITH INTEGRATED CAPACITORS

BACKGROUND

The present invention relates generally to electronic devices and methods of fabrication the same and, more particularly, bulk acoustic wave (BAW) resonator devices and methods of fabricating the same.

Mobile telecommunication devices have been successfully deployed world-wide. With the ramp of 4G/LTE in about 2012 and recent rollout of 5G, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations of conventional RF technology can be an impediment to development of devices to provide services according to these new standards. For example, 5G standards demands high performance RF filters with frequencies around 5 GHz and higher. Filters using bulk acoustic wave resonators (BAWR) are leading candidates for meeting such demands.

SUMMARY

Some embodiments according to the invention provide a device including a piezoelectric layer on a substrate and including a portion included in an acoustic resonator, a first conductive layer on the piezoelectric layer and including a first electrode of the acoustic resonator on a first side of resonator portion of the piezoelectric layer, and a second conductive layer on the piezoelectric layer and including a second electrode of the acoustic resonator on a second side of the resonator portion of the piezoelectric layer. An insulating layer is disposed on the second conductive layer and an interconnection metal layer is electrically connected to the second conductive layer or the first conductive layer and has a portion extending onto the insulating layer and overlapping a portion of the second conductive layer to provide a capacitor electrode of a capacitor coupled to the first electrode and/or the second electrode.

In some embodiments, the device includes a conductive via that electrically connects the interconnection metal layer to the first electrode or the second electrode and the portion of the interconnection metal layer extends onto the insulation layer adjacent a location where the interconnection layer is disposed on and contacts the conductive via. The conductive via may pass through the insulation layer and the piezoelectric layer to contact the first electrode. The capacitor electrode may overlap a portion of the second electrode.

In some embodiments, the conductive via may extend into and contact a first portion of the second conductive layer that is electrically isolated from a second portion of the second conductive layer that is electrically connected to the first electrode. The capacitor electrode may overlap the second portion of the second conductive layer.

In further embodiments, the piezoelectric layer may include a first portion included in a first acoustic resonator and a second portion included in a second acoustic resonator. The first electrode may overlap the first and second portions of the piezoelectric layer and the second electrode may include an electrode overlapping the first portion of the piezoelectric layer and an electrode overlapping the second portion of the piezoelectric layer and the capacitor electrode.

The capacitor may be coupled between an input of the first acoustic resonator and an output of the second acoustic resonator.

In some embodiments, the acoustic resonator may include a first acoustic resonator and a second acoustic resonator coupled in series. The capacitor electrode may include a capacitor electrode of a capacitor coupled across the series combination of the first acoustic resonator and the second acoustic resonator.

Further embodiments provide a device including an acoustic resonator including a first electrode, a second electrode and a piezoelectric region between the first and second electrodes and an insulating layer on the second electrode. The device further includes an interconnection metal layer on the acoustic resonator, connected by a via to the first electrode or the second electrode and having a portion extending onto the insulation layer adjacent the via that serves as a capacitor electrode.

The first electrode may be formed from a first conductive layer. The second electrode may be formed from second conductive layer. The via may connect the interconnection metal layer to the first conductive layer and the capacitor electrode may overlap a portion of the second conductive layer. The first electrode may be formed from a first conductive layer and the second electrode may be formed from second conductive layer. The via may connect the interconnection metal layer to a portion of the second conductive layer electrically connected to the first electrode and the capacitor electrode may overlap the portion of the second conductive layer electrically connected to the first electrode. The piezoelectric region may be formed from a piezoelectric layer and the via may pass through the piezoelectric layer.

According to additional aspects, methods may include forming a piezoelectric layer on a substrate, forming a first conductive layer on a first side of the piezoelectric layer, patterning the first conductive layer to form a first electrode for an acoustic resonator, and forming a second conductive layer on a second side of the piezoelectric layer. The methods further include patterning the second conductive layer to form a second electrode of the acoustic resonator, forming an insulating layer on the second conductive layer, and forming an interconnection metal layer electrically connected to the second electrode layer or the first electrode layer and having a portion extending onto the insulating layer and overlapping a portion of the second conductive layer to provide a capacitor electrode of a capacitor coupled to the first electrode and/or the second electrode.

Forming the interconnection metal layer may be preceded by forming a conductive via electrically connected to the first electrode or the second electrode. Forming the interconnection metal layer may include forming the interconnection layer on the conductive via, wherein the portion of the interconnection metal layer extends onto the insulation layer adjacent a location where the interconnection layer contacts the conductive via. Forming the conductive via may include forming a conductive via that passes through the insulation layer and the piezoelectric layer to contact the first electrode.

BRIEF DESCRIPTION OF THE DRAWINGS

In order to more fully understand embodiments of the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF EXAMPLE EMBODIMENTS

According to the present invention, techniques generally related to electronic devices are provided. More particularly, the present invention provides techniques related to BAW devices and methods of fabricating the same. Merely by way of example, the invention has been applied to a single crystal resonator device for a communication device, mobile device, computing device, among others.

As used herein, the term "substrate" can mean the bulk substrate or can include overlying growth structures such as an aluminum, gallium, or ternary compound of aluminum and gallium and nitrogen containing epitaxial region, or functional regions, combinations, and the like.

Devices according to some embodiments can be manufactured in a relatively simple and cost-effective manner while using conventional materials and/or methods according to one of ordinary skill in the art. Such filters or resonators can be implemented in an RF filter device, an RF filter system, or the like. Depending upon the embodiment, one or more of these benefits may be achieved. Of course, there can be other variations, modifications, and alternatives.

With 4G LTE and 5G growing more popular by the day, wireless data communication demands high performance RF filters with frequencies around 5 GHz and higher. Bulk acoustic wave (BAW) resonators are leading candidates for such applications. BAW resonators typically include a piezoelectric material, e.g., aluminum nitride (AlN), in crystalline form, typically disposed between two electrodes, which commonly include molybdenum (Mo), tungsten (W), or ruthenium (Ru).

Some embodiments of the inventive subject matter use interconnection and insulation layers formed in fabricating BAW resonator-based filters to form capacitors that can be used to improve frequency response characteristics of the filters. Such devices and methods can implement these capacitor structures without major modification of existing techniques for fabrication of the BAW resonators.

Figure 1:
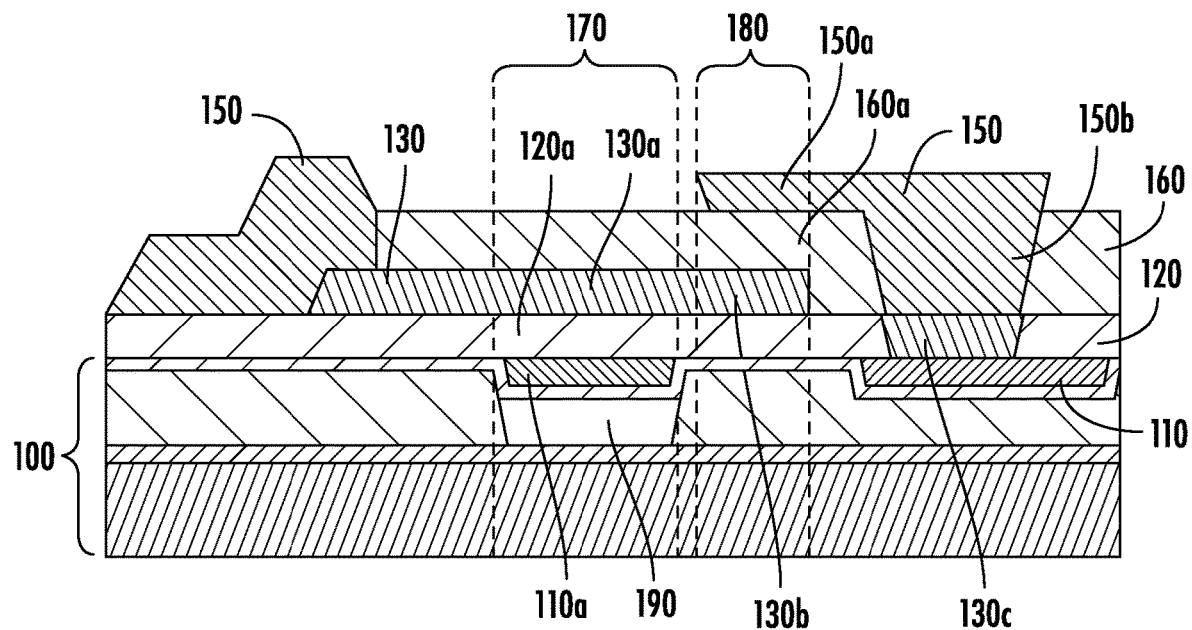
FIG. 1 is simplified cross-sectional view of an acoustic resonator device according to some embodiments.

FIG. 1 illustrates a BAW filter device according to some embodiments. The device includes an acoustic resonator 170 formed in and/or on a substrate 100. A first conductive layer 110 (e.g., a molybdenum (Mo) layer, a ruthenium (Ru) layer, a tungsten (W) layer, or the like) is disposed on the substrate 100. The substrate 100 may include, for example, one or more layers, such as silicon (Si) layers, silicon oxide (SiOx) layers, silicon carbide (SiC) layers, or the like. A piezoelectric layer 120 (e.g., an aluminum nitride (AlN) layer, a gallium nitride (GaN) layer, or the like) is disposed on the first conductive layer 110. A second conductive layer 130 (e.g., a molybdenum (Mo) layer, a ruthenium (Ru) layer, a tungsten (W) layer, or the like) is disposed on the piezoelectric layer 120. A lower electrode 110a of the resonator 170 is formed from the first conductive layer 110 and an upper electrode 130a of the resonator 170 is formed from the second conductive layer 130, on opposite sides of a portion 120a of the piezoelectric layer 120. An insulation layer 160 (e.g., a silicon nitride (SiN) layer, a silicon oxide (SiOx) layer or the like) is disposed on the second conductive layer 130. An interconnection (IC) metal layer 150 (e.g., a layer comprising gold (Au), aluminum (Al), copper (Cu), nickel (Ni), aluminum bronze (AlCu), or other like materials) is disposed on the insulation layer 160.

Figure 2:
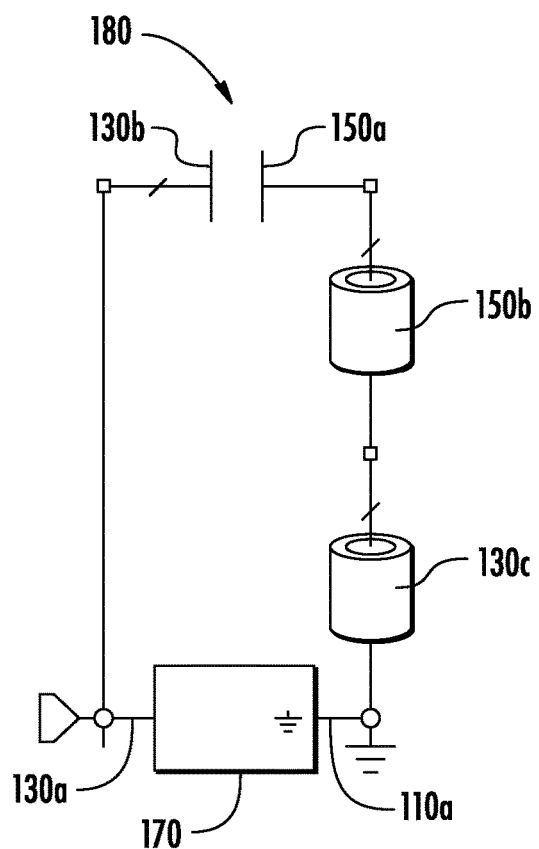
FIG. 2 is a schematic illustration of a circuit implemented by the device of FIG. 1.

An electrode for a capacitor 180 electrically coupled between the bottom electrode 110a and the top electrode 130a comprises an extension 150a of the IC metal layer 150 adjacent a via including a portion 130c of the second conductive layer 130 and a portion 150b of the IC metal layer 150. The capacitor electrode provided by the IC metal layer extension 150a overlaps a portion 130b of the first conductive layer 130, which serves as second capacitor electrode. The capacitor dielectric is provided by a portion 160a of the insulation layer 160 between the IC metal layer extension 150a and the underlying portion 130b of the second conductive layer 130. FIG. 2 is a simplified schematic diagram illustrating the electrical interconnections of the resonator 170 and the capacitor 180, showing that the capacitor 180 is connected between input and output terminals of the resonator 170.

Figure 3:
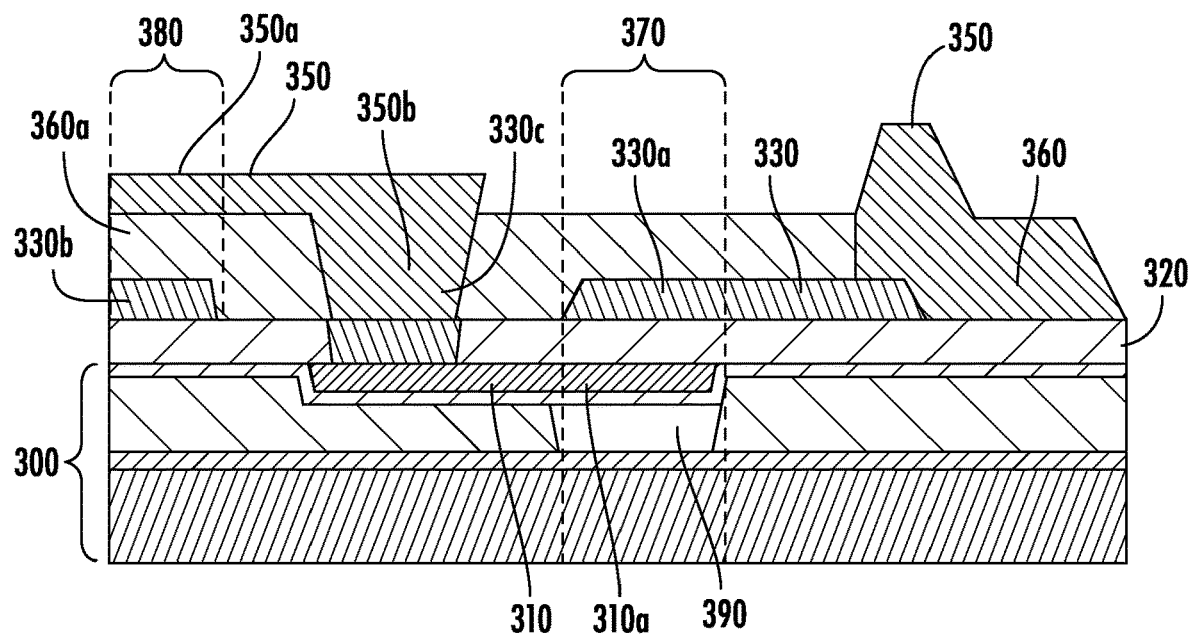
FIG. 3 is simplified cross-sectional view of an acoustic resonator device according to some embodiments.

FIG. 3 illustrates a BAW filter device according to further embodiments. The device includes an acoustic resonator 370 disposed in and/or on a substrate 300. A first conductive layer 310 (e.g., a molybdenum (Mo) layer, a ruthenium (Ru) layer, a tungsten (W) layer, or the like) is disposed on the substrate 300. A piezoelectric material layer 320 (e.g., an aluminum nitride (AlN) layer, a gallium nitride (GaN) layer, or the like) is disposed on the first conductive layer 310. A second conductive layer 330 (e.g., a molybdenum (Mo) layer, a ruthenium (Ru) layer, a tungsten (W) layer, or the like) is disposed on the piezoelectric layer 320. A lower electrode 310a of the resonator 370 is formed from the first conductive layer 310 and an upper electrode 330a of the resonator 370 is formed from the second conductive layer 330, on opposite sides of a portion 320a of the piezoelectric layer 320, thus forming the resonator 370.

Figure 4:
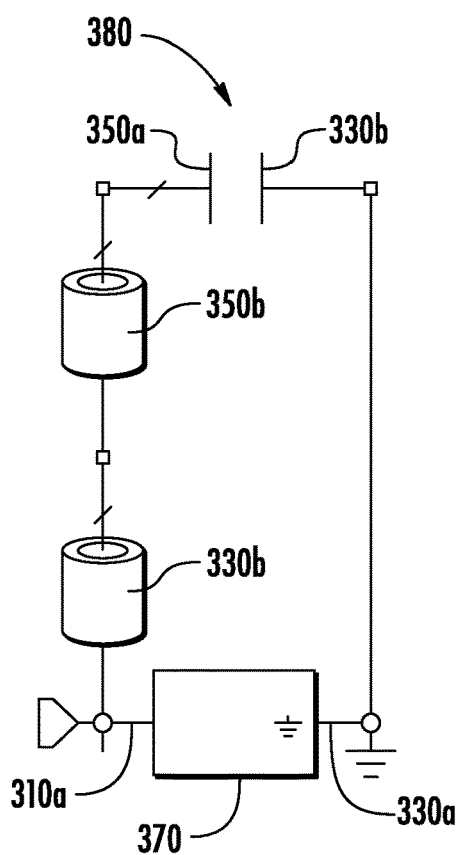
FIG. 4 is a schematic illustration of a circuit implemented by the device of FIG. 3.

An insulation layer 360 (e.g., a silicon nitride (SiN) layer, a silicon oxide (SiOx) layer or the like) is disposed on the second conductive layer 330. An interconnection (IC) metal layer 350 (e.g., a layer comprising gold (Au), aluminum (Al), copper (Cu), nickel (Ni), aluminum bronze (AlCu), or other like materials) is disposed on the insulation layer 360. As shown, an electrode of a capacitor 380 electrically coupled between the bottom electrode 310a and the top electrode 330a is formed from an extension 350a of the IC metal layer 350 adjacent a via including a portion 330c of the second conductive layer 330 and a portion 350b of the IC metal layer 350. The capacitor electrode provided by the extension 350a overlies a portion 330b of the first conductive layer 330, which serves as second capacitor electrode. The capacitor dielectric is provided by a portion 360a of the insulation layer 360 between the IC metal layer extension 350a and the underlying portion 330b of the second conductive layer 330. FIG. 4 is a simplified schematic diagram illustrating the electrical interconnections of the resonator 370 and the capacitor 380, showing that the capacitor 380 is connected between input and output terminals of the resonator 370.

Figure 5:
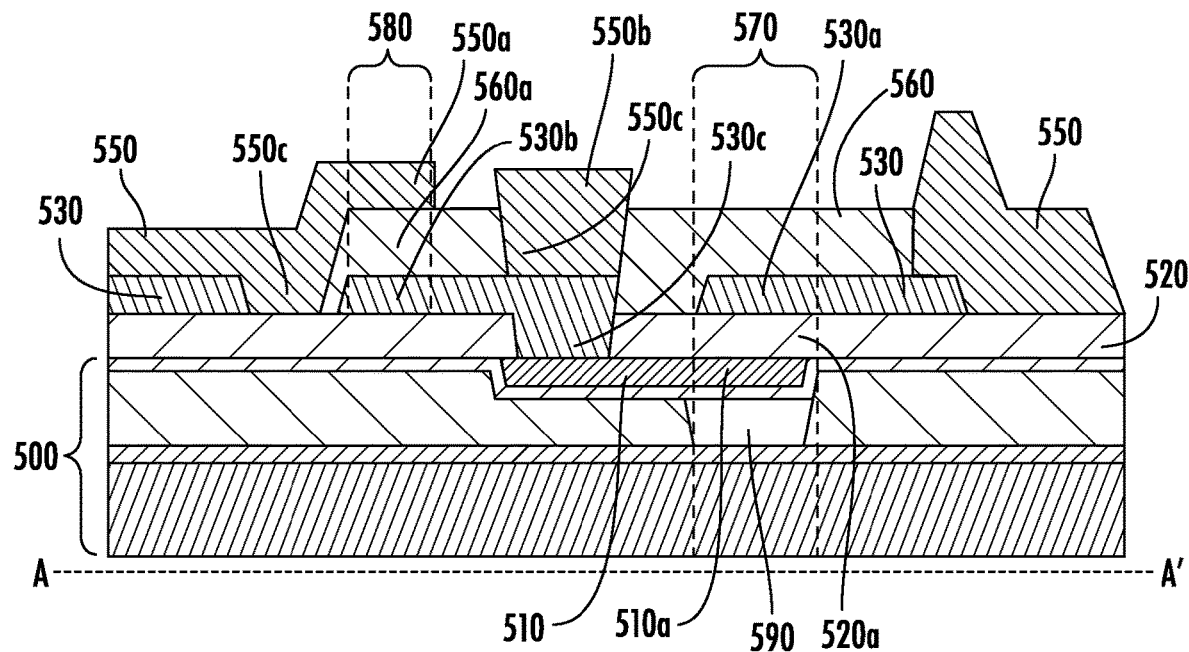
FIG. 5 is simplified cross-sectional view of an acoustic resonator device according to some embodiments.
Figure 6:
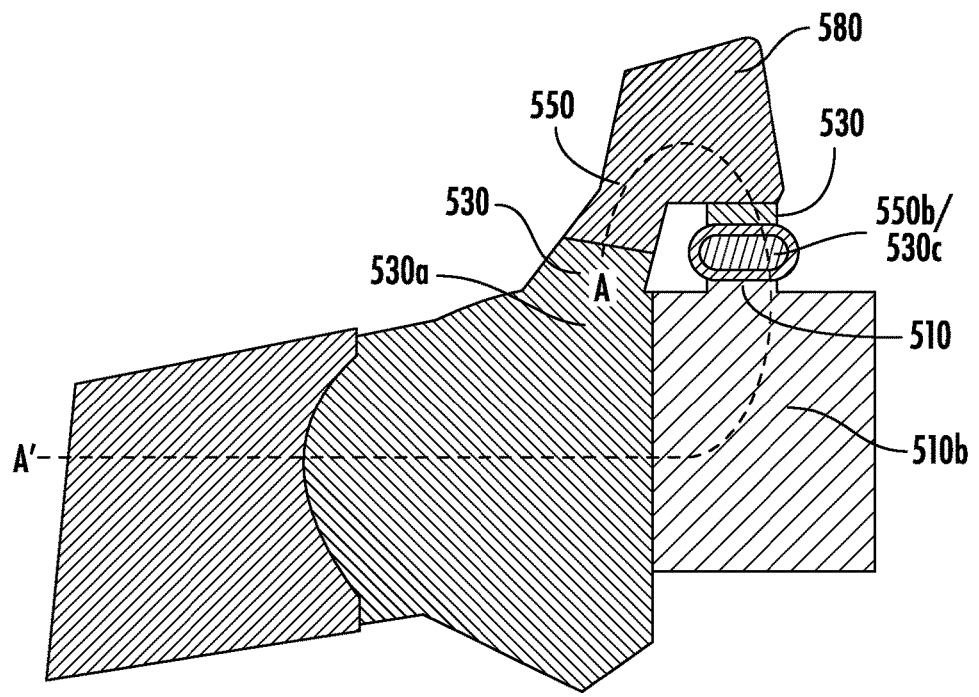
FIG. 6 is a simplified plan view of the device of FIG. 5
Figure 7:
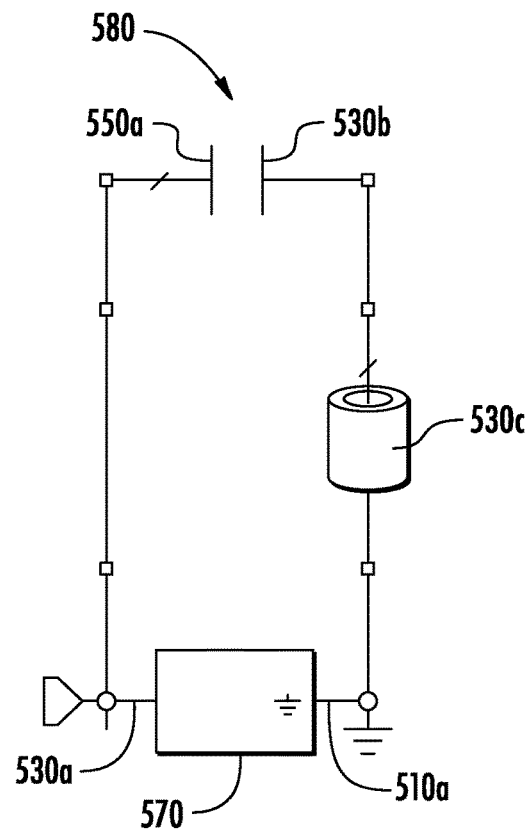
FIG. 7 is a schematic illustration of a circuit implemented by the device of FIG. 5.

FIGS. 5-7 illustrate a BAW filter device according to some embodiments. The device includes an acoustic resonator 570 disposed on a substrate 500. A first conductive layer 510 (e.g., a molybdenum (Mo) layer, a ruthenium (Ru) layer, a tungsten (W) layer, or the like) is disposed on the substrate 500. A piezoelectric material layer 520 (e.g., an aluminum nitride (AlN) layer, a gallium nitride (GaN) layer, or the like) is disposed on the first conductive layer 510. A second conductive layer 530 (e.g., a molybdenum (Mo) layer, a ruthenium (Ru) layer, a tungsten (W) layer, or the like) is disposed on the piezoelectric layer 520. A lower electrode 510a of the resonator 570 is formed from the first conductive layer 510 and an upper electrode 530a of the resonator 570 is formed from the second conductive layer 530, on opposite sides of a portion 520a of the piezoelectric layer 520.

An insulation layer 560 (e.g., a silicon nitride (SiN) layer, a silicon oxide (SiOx) layer or the like) is disposed on the second conductive layer 530. An interconnection (IC) metal layer 550 (e.g., a layer comprising gold (Au), aluminum (Al), copper (Cu), nickel (Ni), aluminum bronze (AlCu), or other like materials) is disposed on the insulation layer 560. As shown, an electrode of a capacitor 580 electrically coupled between the bottom electrode 510a and the top electrode 530a is formed from an extension 550a of the IC metal layer 550 adjacent a via including a portion 550c of the IC metal layer 550. The capacitor electrode provided by the extension 550a overlies a portion 530b of the first conductive layer 530, which serves as second capacitor electrode. The capacitor dielectric is provided by a portion 560a of the insulation layer 560 between the IC metal layer extension 550a and the underlying portion 530b of the second conductive layer 530. FIG. 7 is a simplified schematic diagram illustrating the electrical interconnections of the resonator 570 and the capacitor 580, showing that the capacitor 580 is connected between input and output terminals of the resonator 570.

Figure 8:
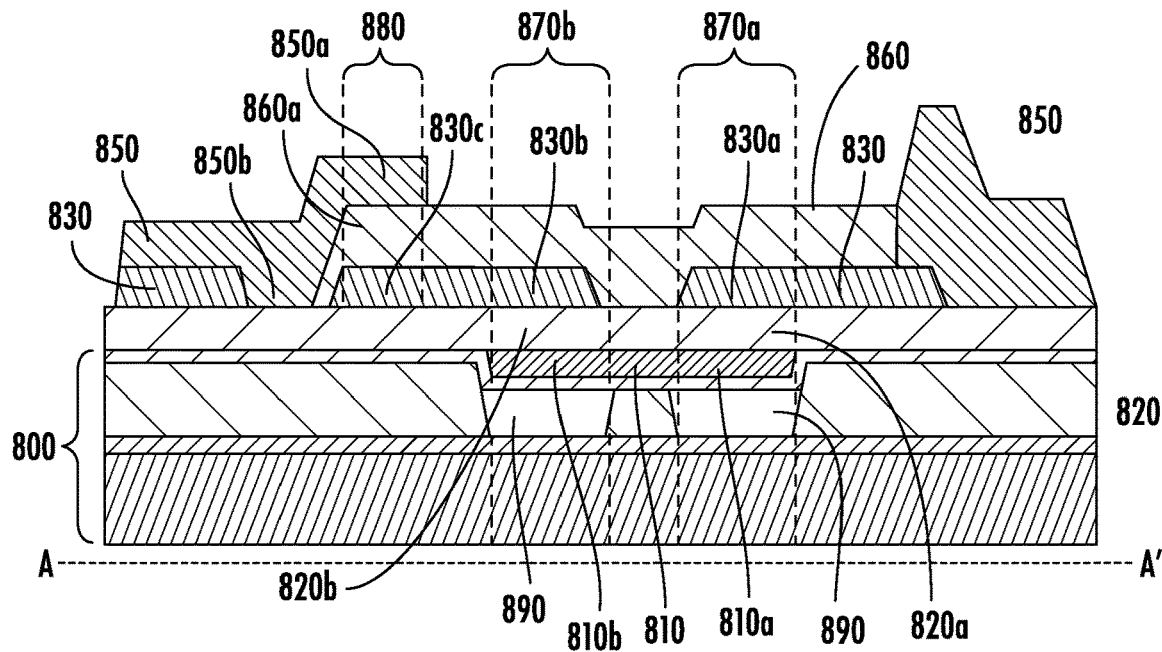
FIG. 8 is simplified cross-sectional view of an acoustic resonator device according to some embodiments.
Figure 9:
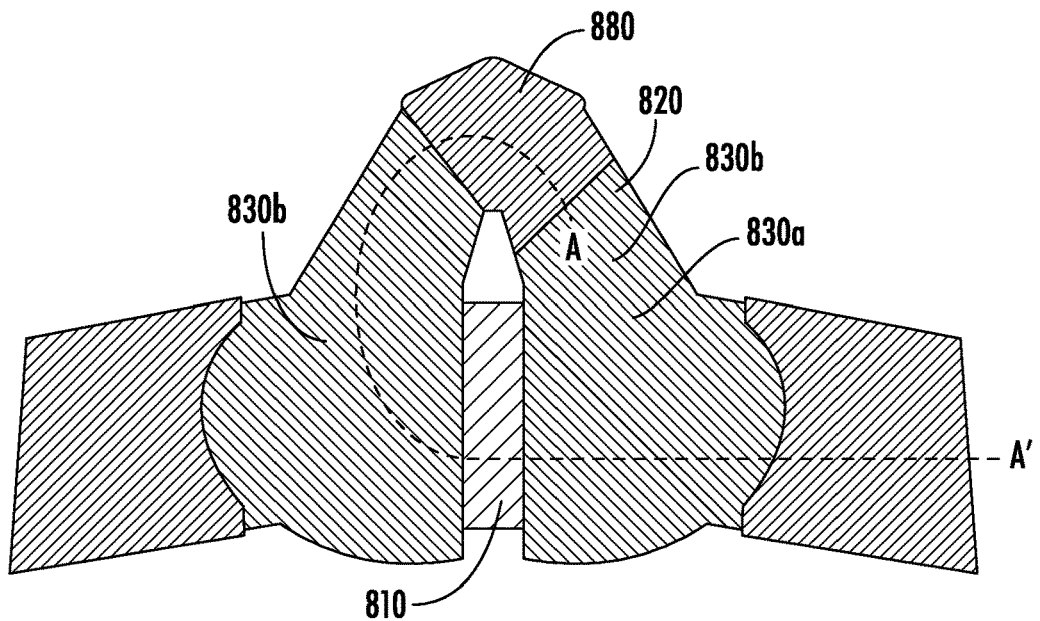
FIG. 9 is a simplified plan view of the device of FIG. 8
Figure 10:
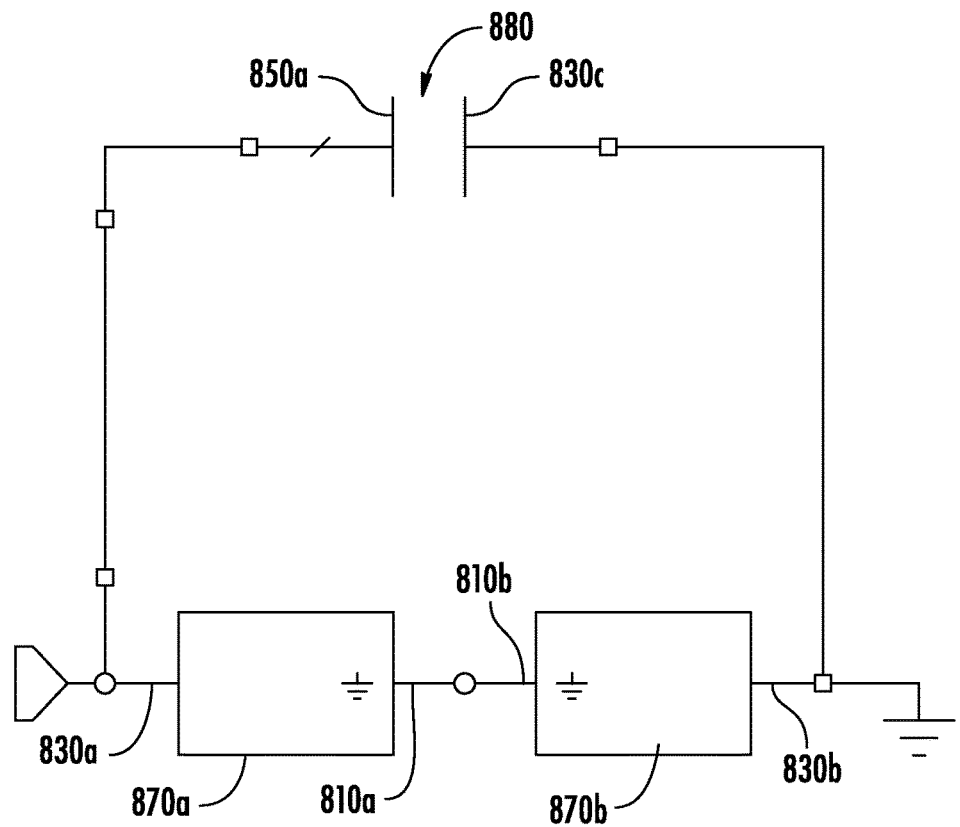
FIG. 10 is a schematic illustration of a circuit implemented by the device of FIG. 8.

FIGS. 8-10 illustrate a BAW filter device according to further embodiments. The device includes first and second acoustic resonators 870a, 870b disposed on a substrate 800. A first conductive layer 810 (e.g., a molybdenum (Mo) layer, a ruthenium (Ru) layer, a tungsten (W) layer, or the like) is disposed on the substrate 800. A piezoelectric material layer 820 (e.g., an aluminum nitride (AlN) layer, a gallium nitride (GaN) layer, or the like) is disposed on the first conductive layer 810. A second conductive layer 830 (e.g., a molybdenum (Mo) layer, a ruthenium (Ru) layer, a tungsten (W) layer, or the like) is disposed on the piezoelectric layer 820. A lower electrode 810a of the first resonator 870a is formed from the first conductive layer 810 and an upper electrode 830a of the first resonator 870a is formed from the second conductive layer 830, on opposite sides of a portion 820a of the piezoelectric layer 820. A lower electrode 810b of the second resonator 870b is formed from the first conductive layer 810 and an upper electrode 830b of the second resonator 870b is formed from the second conductive layer 830, on opposite sides of a portion 820b of the piezoelectric layer 820.

An insulation layer 860 (e.g., a silicon nitride (SiN) layer, a silicon oxide (SiOx) layer or the like) is disposed on the second conductive layer 830. An interconnection (IC) metal layer 850 (e.g., a layer comprising gold (Au), aluminum (Al), copper (Cu), nickel (Ni), aluminum bronze (AlCu), or other like materials) is disposed on the insulation layer 860. As shown, an electrode of a capacitor 880 electrically coupled between the bottom electrode 810a and the top electrode 830a is formed from an extension 850a of the IC metal layer 850 adjacent a via including a portion 850b of the IC metal layer 850. The capacitor electrode provided by the extension 850a overlies a portion 830c of the first conductive layer 830, which serves as second capacitor electrode. The capacitor dielectric is provided by a portion 860a of the insulation layer 860 between the IC metal layer extension 850a and the underlying portion 830c of the second conductive layer 830. FIG. 10 is a simplified schematic diagram illustrating the electrical interconnections of the first and second resonators 870a, 870b and the capacitor 880, showing that the capacitor 880 is connected between input terminal of the first resonator 870a and the output terminal of the second resonator 870b.

Figure 11:
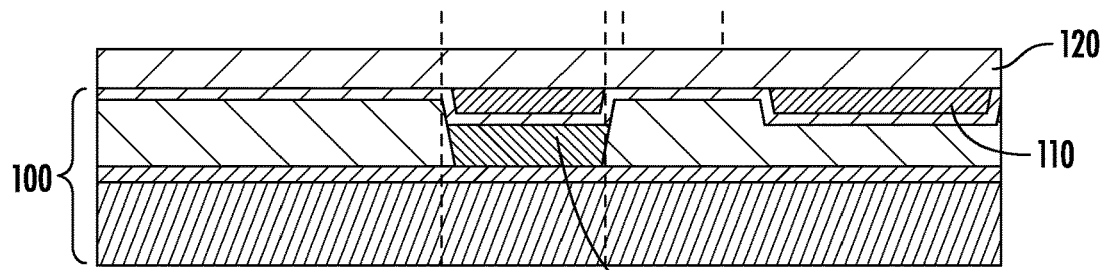
FIGS. 11-14 are cross-sectional views illustrating operations for fabricating the device of FIG. 1 according to some embodiments.

FIGS. 11-14 illustrate operations for fabricating the device of FIG. 1 according to some embodiments. Referring to FIG. 11, a first conductive layer 110 and a piezoelectric layer 120 are formed in a substrate 100, with at least a portion of the first conductive layer 510 overlying a sacrificial layer 192. The first conductive layer 110 may be formed by deposition of molybdenum (Mo), ruthenium (Ru), tungsten (W) layer, or the like. The piezoelectric material layer 120 may be formed by deposition of aluminum nitride (AlN), gallium nitride (GaN), or the like. The sacrificial layer 192 can comprise, for example, polycrystalline silicon, amorphous silicon, silicon oxide (SiOx), or the like. The structure illustrated in FIG. 11 can be fabricated, for example, using operations of a transfer process along the lines of processes described in U.S. Pat. No. 10,355,659 to Kim et al., the disclosure of which is incorporated herein by reference in its entirety.

Figure 12:
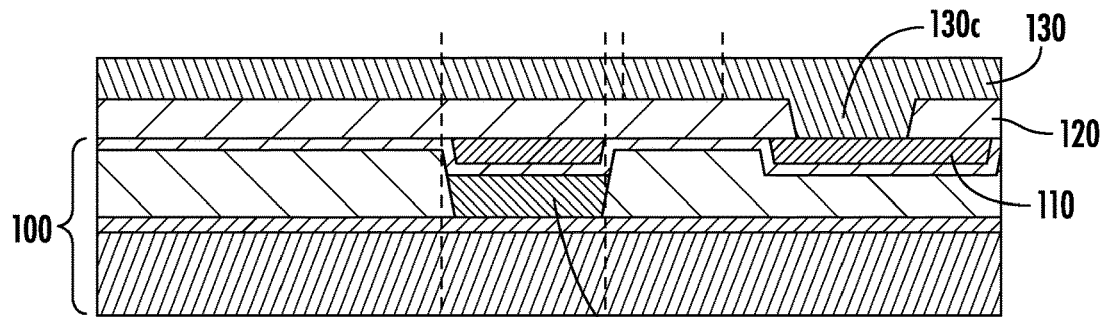
Figure 13:
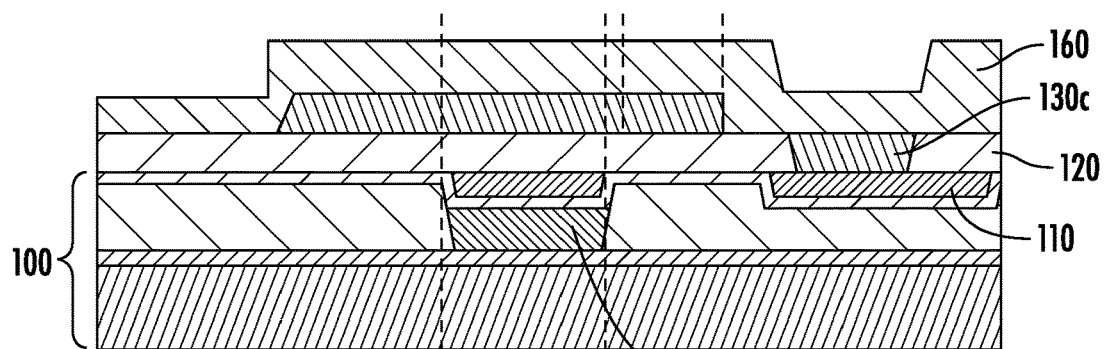
Figure 14:
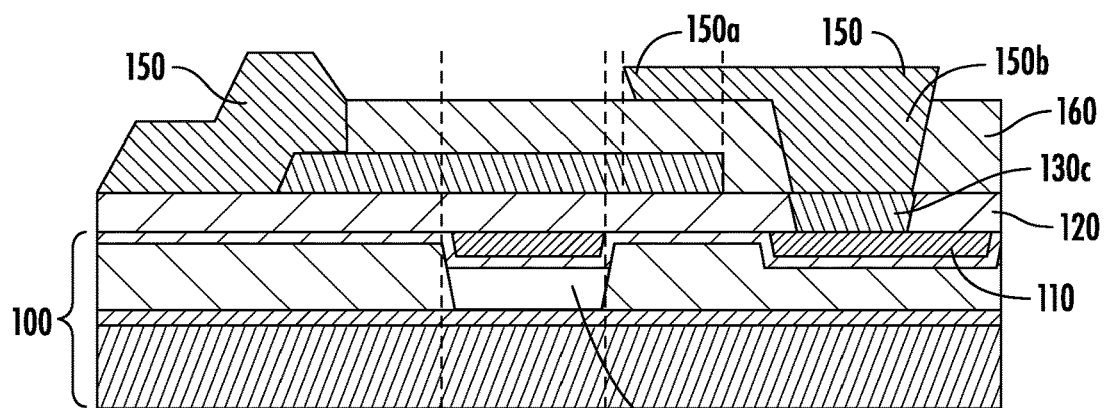

Referring to FIG. 12, a portion of the piezoelectric layer 120 is removed to expose a portion of the first conductive layer 110, and a second conductive layer 130 is formed on the piezoelectric layer 120. The second conductive layer 130 forms a via 130c contacting the exposed portion of the first conductive layer 510. The second conductive layer 130 may be formed, for example, by deposition of molybdenum (Mo), ruthenium (Ru), tungsten (W), or the like. Referring to FIG. 13, the second conductive layer 130 is patterned and then an insulation layer 160 (e.g., a silicon nitride (SiN) layer, silicon oxide (SiOx) layer, or the like) is formed on the patterned second conductive layer 130. Referring to FIG. 14, the insulation layer 160 is patterned, including exposing portions of the second conductive layer 130, followed by forming an IC metal layer 150 (e.g., a layer comprising gold (Au), aluminum (Al), copper (Cu), nickel (Ni), aluminum bronze (AlCu), or other like materials) and removing the sacrificial layer 192 to form an air pocket 190.

Figure 15:
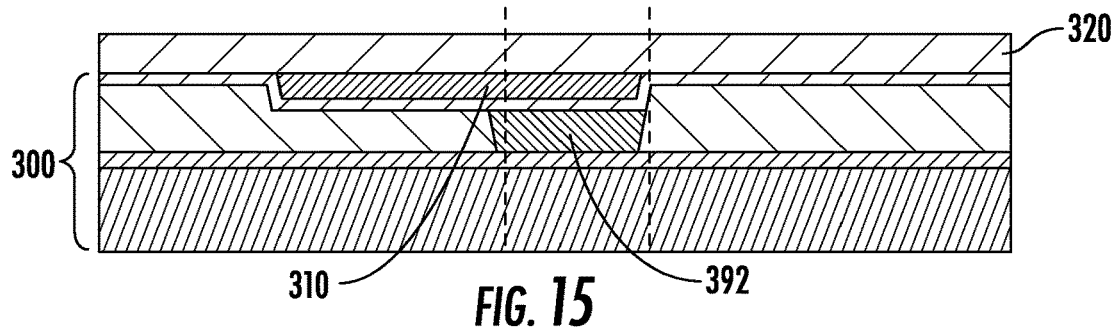
FIGS. 15-18 are cross-sectional views illustrating operations for fabricating the device of FIG. 3 according to some embodiments.

FIGS. 15-18 illustrate operations for fabricating the device of FIG. 3 according to some embodiments. Referring to FIG. 15, a first conductive layer 310 and a piezoelectric layer 320 are formed in a substrate 300, with at least a portion of the first conductive layer 310 overlying a sacrificial layer 392. The first conductive layer 310 may be formed by deposition of molybdenum (Mo), ruthenium (Ru), tungsten (W) layer, or the like. The piezoelectric material layer 320 may be formed by deposition of aluminum nitride (AlN), gallium nitride (GaN), or the like. The sacrificial layer 392 can comprise, for example, polycrystalline silicon, amorphous silicon, silicon oxide (SiOx), or the like. The structure illustrated in FIG. 15 can be fabricated, for example, using operations of a transfer process along the lines of processes described in the aforementioned U.S. Pat. No. 10,355,659 to Kim et al.

Figure 16:
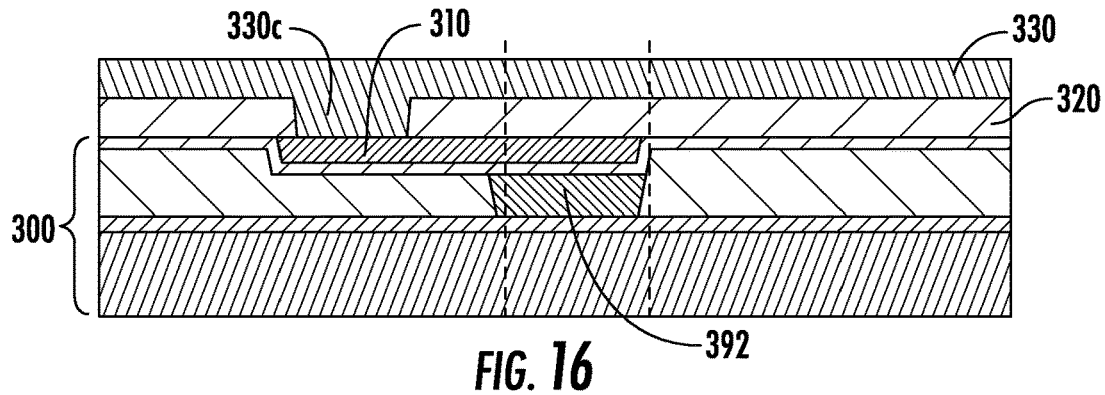
Figure 17:
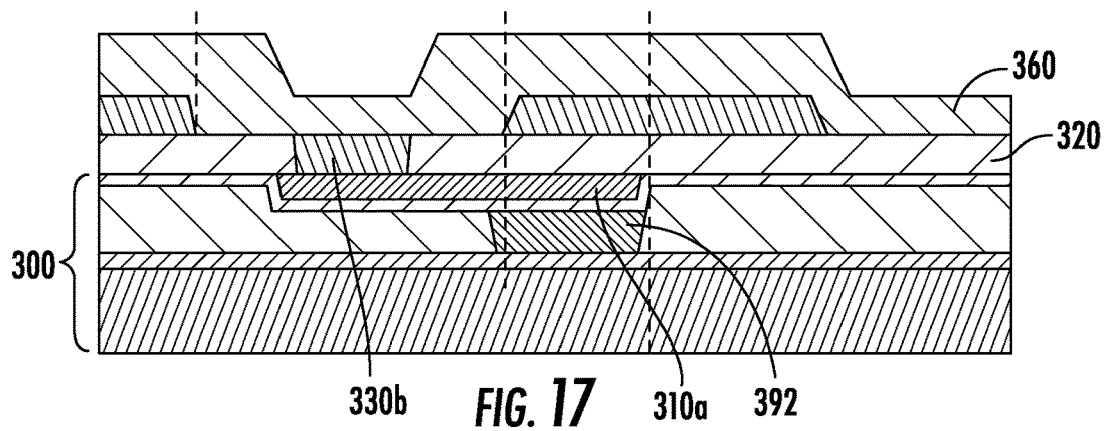
Figure 18:
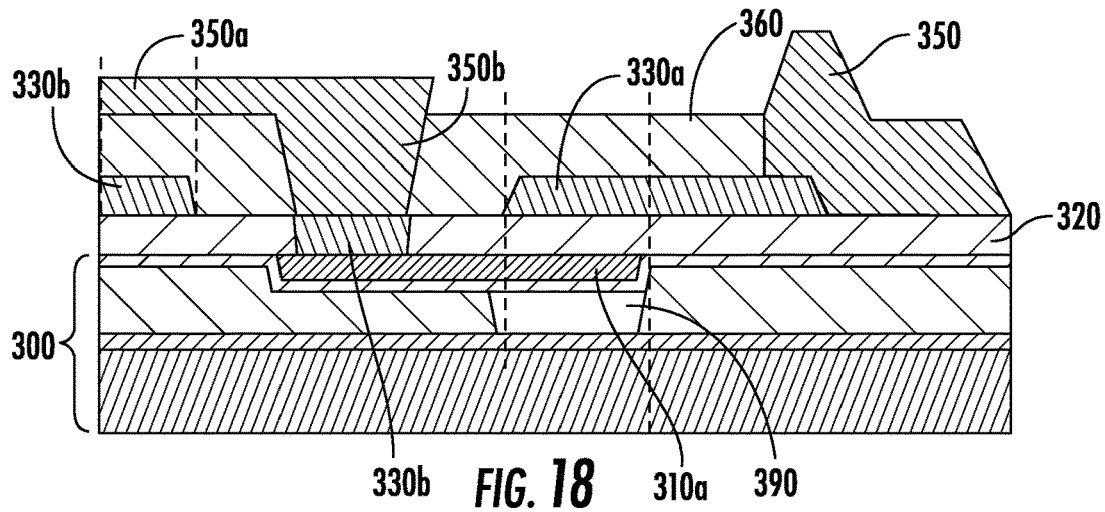

Referring to FIG. 16, a portion of the piezoelectric layer 320 is removed to expose a portion of the first conductive layer 310, and a second conductive layer 330 is formed on the piezoelectric layer 320. The second conductive layer 330 forms a via 330b contacting the exposed portion of the first conductive layer 310. The second conductive layer 330 may be formed, for example, by deposition of molybdenum (Mo), ruthenium (Ru), tungsten (W), or the like. Referring to FIG. 17, the second conductive layer 330 is patterned and then an insulation layer 360 is formed on the patterned second conductive layer 330. Referring to FIG. 18, the insulation layer 360 is patterned, including exposing portions of the second conductive layer 330, followed by forming an IC metal layer 350 (e.g., a layer comprising gold (Au), aluminum (Al), copper (Cu), nickel (Ni), aluminum bronze (AlCu), or other like materials) and removing the sacrificial layer 192 to form an air pocket 190.

Figure 19:
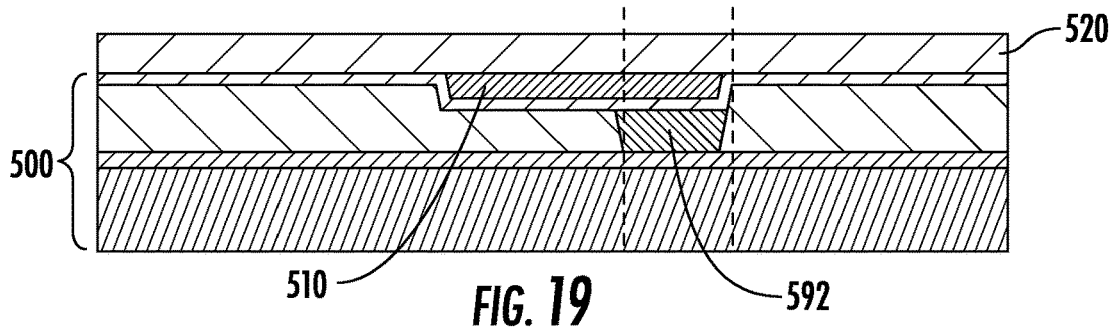
FIGS. 19-22 are cross-sectional views illustrating operations for fabricating the device of FIG. 5 according to some embodiments.

FIGS. 19-22 illustrate operations for fabricating the device of FIG. 5 according to some embodiments. Referring to FIG. 19, a first conductive layer 510 and a piezoelectric layer 520 are formed in a substrate 500, with at least a portion of the first conductive layer 510 overlying a sacrificial layer 592. The first conductive layer may be formed by deposition of molybdenum (Mo), ruthenium (Ru), tungsten (W) layer, or the like. The piezoelectric material layer 520 may be formed by deposition of aluminum nitride (AlN), gallium nitride (GaN), or the like. The sacrificial layer 592 can comprise, for example, polycrystalline silicon, amorphous silicon, silicon oxide (SiOx), or the like. The structure illustrated in FIG. 11 can be fabricated, for example, using operations of a transfer process along the lines of processes described in the aforementioned U.S. Pat. No. 10,355,659 to Kim et al.

Figure 20:
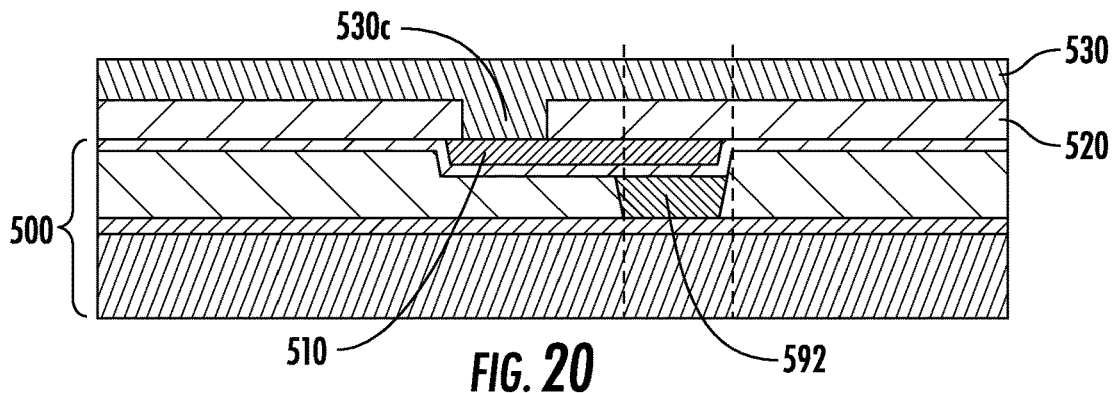
Figure 21:
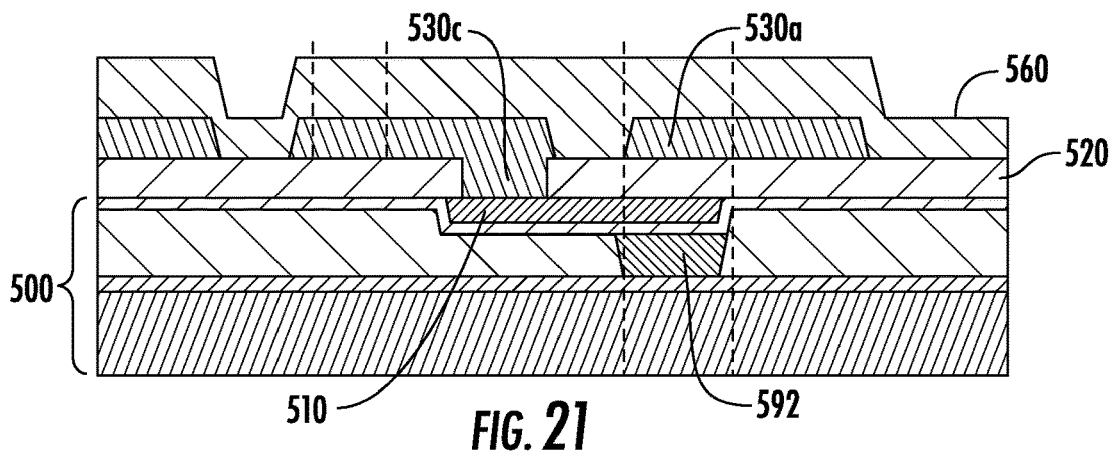
Figure 22:
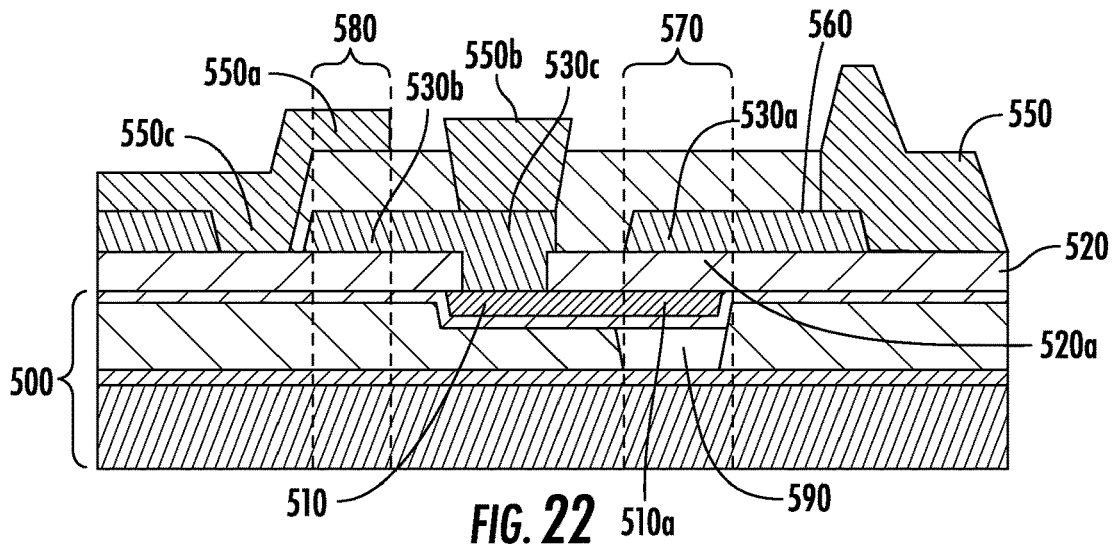

Referring to FIG. 20, a portion of the piezoelectric layer 520 is removed to expose a portion of the first conductive layer 510, and a second conductive layer 530 is formed on the piezoelectric layer 520. The second conductive layer 530 forms a via 530c contacting the exposed portion of the first conductive layer 510. The second conductive layer 530 may be formed, for example, by deposition of molybdenum (Mo), ruthenium (Ru), tungsten (W), or the like. Referring to FIG. 21, the second conductive layer 530 is patterned and then an insulation layer 560 is formed on the patterned second conductive layer 530. Referring to FIG. 22, the insulation layer 560 is patterned, including exposing portions of the second conductive layer 530, followed by forming an IC metal layer 550 (e.g., a layer comprising gold (Au), aluminum (Al), copper (Cu), nickel (Ni), aluminum bronze (AlCu), or other like materials) and removing the sacrificial layer 592 to form an air pocket under the resonator 570.

Figure 23:
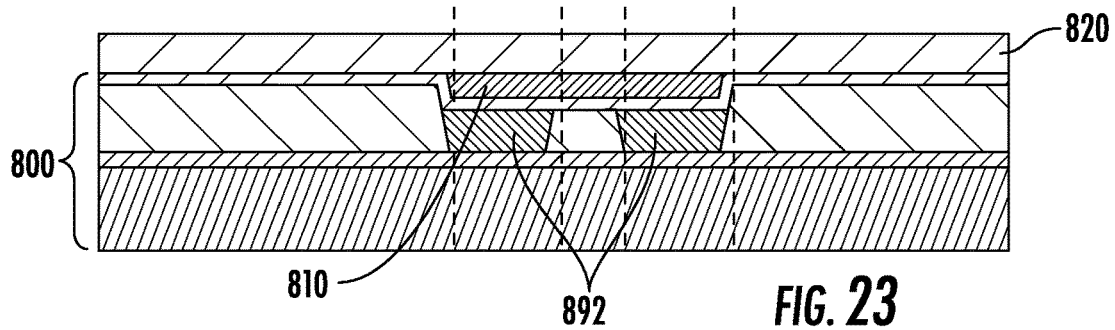
FIGS. 23-26 are cross-sectional views illustrating operations for fabricating the device of FIG. 8 according to some embodiments.

FIGS. 23-26 illustrates operations for fabricating the device of FIG. 8 according to some embodiments. Referring to FIG. 23, a substrate 800 is formed including a first conductive layer 810 and a piezoelectric layer 820, with at least a portion of the first conductive layer 810 overlying a sacrificial layer 892. The first conductive layer may be formed by deposition of molybdenum (Mo), ruthenium (Ru), tungsten (W) layer, or the like. The piezoelectric material layer 820 may be formed by deposition of aluminum nitride (AlN), gallium nitride (GaN), or the like. The sacrificial layer 892 may be formed from, for example, polycrystalline silicon, amorphous silicon, silicon oxide, or the like. The structure illustrated in FIG. 23 can be fabricated, for example, using operations of a transfer process along the lines of processes described in the aforementioned U.S. Pat. No. 10,355,659 to Kim et al.

Figure 24:
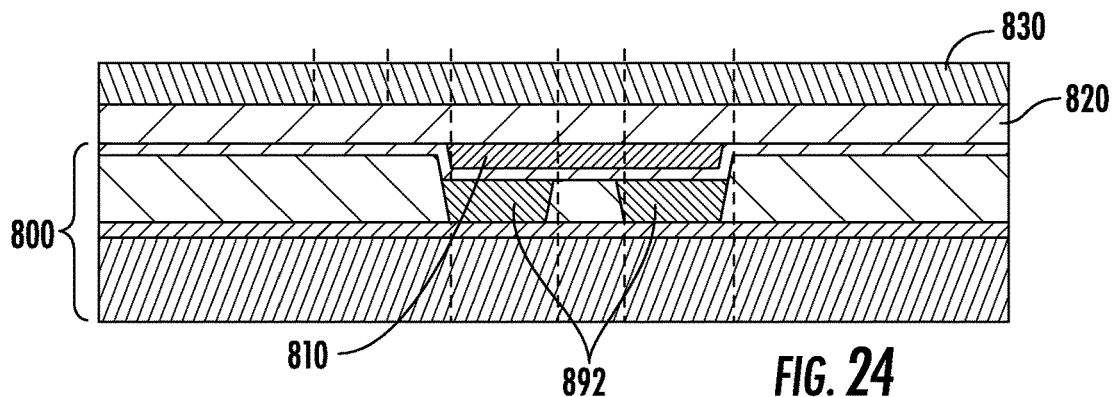
Figure 25:
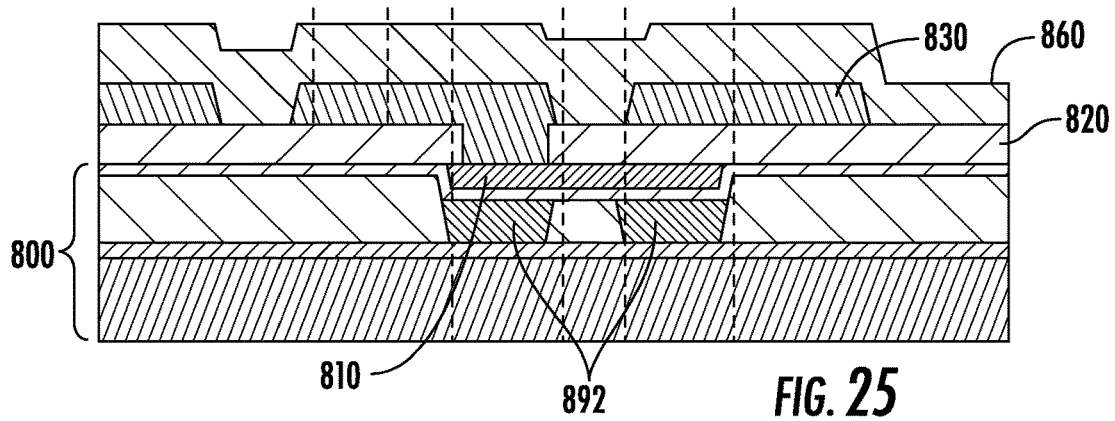
Figure 26:
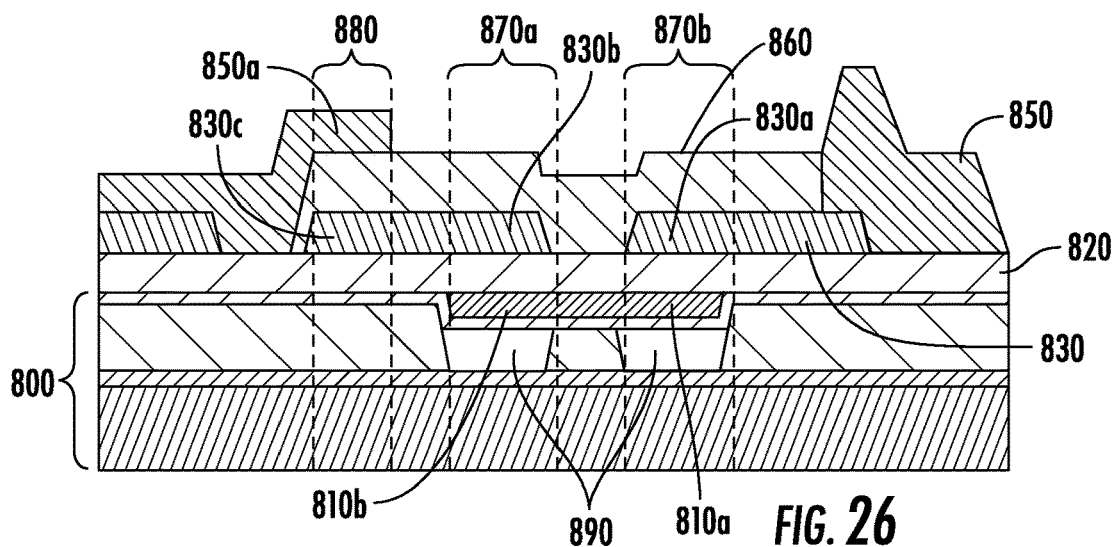

Referring to FIG. 24, a second conductive layer 830 is formed on the piezoelectric layer 820. The second conductive layer 830 may be formed, for example, by deposition of molybdenum (Mo), ruthenium (Ru), tungsten (W), or the like. Referring to FIG. 25, the second conductive layer 830 is patterned to expose portions of the piezoelectric layer 820. An insulation layer 860 is then formed on the patterned second conductive layer 830. Referring to FIG. 26, the insulation layer 860 is patterned, including exposing portions of the second conductive layer 830, followed by forming and patterning an IC metal layer 850 (e.g., a layer comprising gold (Au), aluminum (Al), copper (Cu), nickel (Ni), aluminum bronze (AlCu), or other like materials) and removing the sacrificial layer 892 to form an air pocket 890 underlying first and second resonators 870a, 870b.

Figure 27:
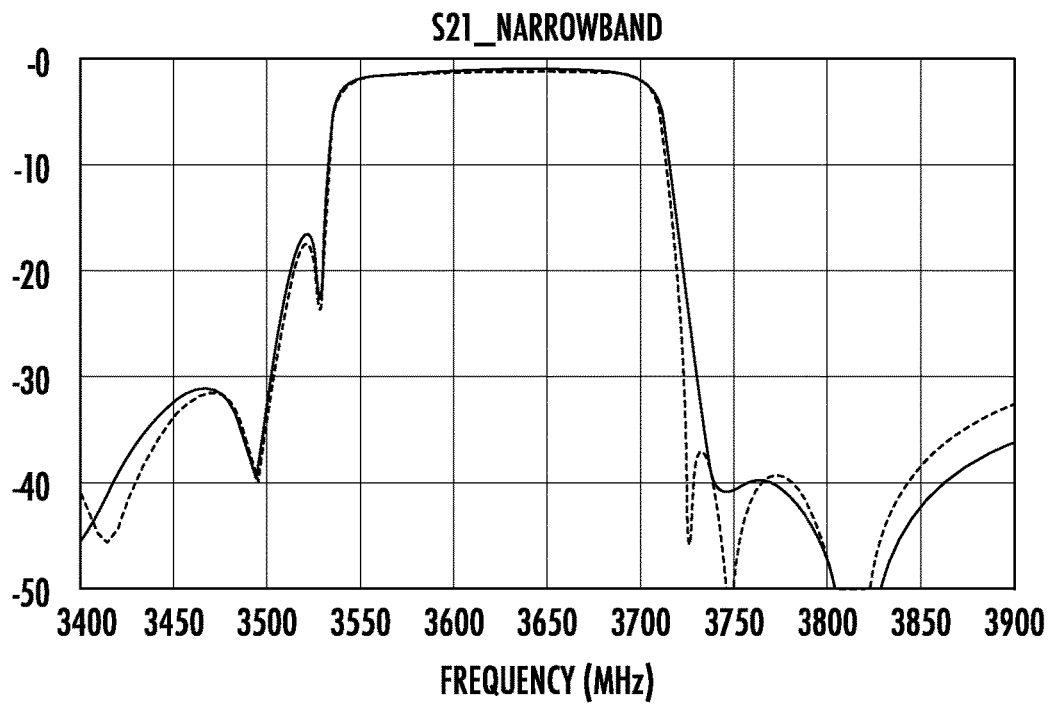
FIGS. 27 and 28 are graphs of simulated performance of a BAW resonator filter device with integrated capacitors according to some embodiments.
Figure 28:
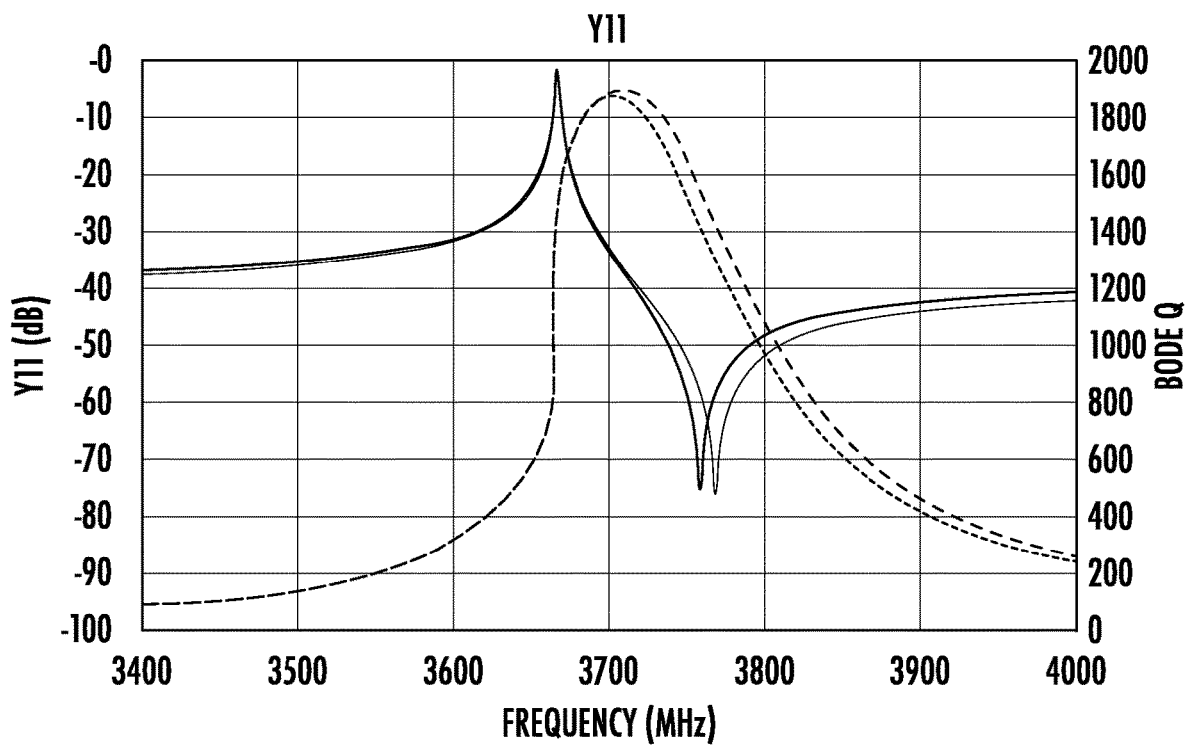

FIGS. 27 and 28 illustrate a simulated frequency response and Q, respectively, of a BAW resonator filter incorporating an integrated capacitor along the lines described above. The capacitor may have an area in a range of 100 Å to 20,000 Å and a capacitance in a range from about 0.05 pf to about 5 pf. The addition of the capacitor can increase the sharpness of the upper passband skirt without appreciably affecting Q of the filter in comparison with a device lacking such a capacitor. Such on-chip capacitors can also be used to improve other filter performance parameters, such as rejection, matching and harmonic rejection. The capacitor can improve nearby rejection without substantially increasing injection loss. A standalone resonator without such a capacitor may require a Q of 2500-3500 to provide similar performance.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed:
1. A device comprising:
   a piezoelectric layer on a substrate and comprising a portion included in an acoustic resonator;
   a first conductive layer on the piezoelectric layer and comprising a first electrode of the acoustic resonator on a first side of resonator portion of the piezoelectric layer;

a second conductive layer on the piezoelectric layer and comprising a second electrode of the acoustic resonator on a second side of the resonator portion of the piezoelectric layer;
an insulating layer on the second conductive layer; and
an interconnection metal layer electrically connected to the second conductive layer or the first conductive layer and having a portion extending onto the insulating layer and overlapping a portion of the second conductive layer to provide a first capacitor electrode of a capacitor disposed laterally adjacent the acoustic resonator, coupled to the first electrode and/or the second electrode and having a portion of the second conductive layer as a second capacitor electrode of the capacitor and a portion of the insulating layer between the first and second capacitor electrodes as a dielectric of the capacitor, wherein the acoustic resonator comprises a first acoustic resonator and a second acoustic resonator coupled in series and wherein the capacitor is coupled across the series combination of the first acoustic resonator and the second acoustic resonator.

2. The device of claim 1, further comprising a conductive via that electrically connects the interconnection metal layer to the first electrode or the second electrode and wherein the portion of the interconnection metal layer extends onto the insulating layer adjacent a location where the interconnection layer is disposed on and contacts the conductive via.

3. The device of claim 2, wherein the conductive via passes through the insulating layer and the piezoelectric layer to contact the first electrode.

4. The device of claim 3, wherein the first capacitor electrode overlaps a portion of the second electrode.

5. The device of claim 2:
wherein the piezoelectric layer comprises a first portion included in a first acoustic resonator and a second portion included in a second acoustic resonator;
wherein the first electrode overlaps the first and second portions of the piezoelectric layer; and
wherein the second electrode comprises an electrode overlapping the first portion of the piezoelectric layer and an electrode overlapping the second portion of the piezoelectric layer and the capacitor electrode.

6. The device of claim 5, wherein the capacitor is coupled between an input of the first acoustic resonator and an output of the second acoustic resonator.

7. The device of claim 1, wherein the capacitor electrode comprises a capacitor electrode of a capacitor coupled between the first and second electrodes of the acoustic resonator.

8. A method comprising:
forming a piezoelectric layer on a substrate;
forming a first conductive layer on a first side of the piezoelectric layer;
patterning the first conductive layer to form a first electrode for an acoustic resonator;
forming a second conductive layer on a second side of the piezoelectric layer;
patterning the second conductive layer to form a second electrode of the acoustic resonator;
forming an insulating layer on the second conductive layer; and
forming an interconnection metal layer electrically connected to the second electrode layer or the first electrode layer and having a portion extending onto the insulating layer and overlapping a portion of the second conductive layer to provide a first capacitor electrode of a capacitor coupled to the first electrode and/or the second electrode, disposed laterally adjacent the acoustic resonator, and having a portion of the second conductive layer as a second capacitor electrode of the capacitor and a portion of the insulating layer between the first and second capacitor electrodes as a dielectric of the capacitor, wherein the acoustic resonator comprises a first acoustic resonator and a second acoustic resonator coupled in series and wherein the capacitor is coupled across the series combination of the first acoustic resonator and the second acoustic resonator.

9. The method of claim 8, wherein forming the interconnection metal layer is preceded by forming a conductive via electrically connected to the first electrode or the second electrode, wherein forming the interconnection metal layer comprises forming the interconnection layer on the conductive via, and wherein the portion of the interconnection metal layer extends onto the insulating layer adjacent a location where the interconnection layer contacts the conductive via.

10. The method of claim 9, wherein forming the conductive via comprises forming a conductive via that passes through the insulating layer and the piezoelectric layer to contact the first electrode.

11. The method of claim 10, wherein the first capacitor electrode overlaps a portion of the second electrode.

12. The method of claim 9:
wherein the piezoelectric layer comprises a first portion included in a first acoustic resonator and a second portion included in a second acoustic resonator;
wherein the first electrode overlaps the first and second portions of the piezoelectric layer; and
wherein the second electrode comprises an electrode overlapping the first portion of the piezoelectric layer and an electrode overlapping the second portion of the piezoelectric layer and the first capacitor electrode.

13. The method of claim 12, wherein the capacitor is coupled between an input of the first acoustic resonator and an output of the second acoustic resonator.

14. The method of claim 8, wherein the capacitor is coupled between the first and second electrodes of the acoustic resonator.

15. A device comprising:
an acoustic resonator comprising a first electrode, a second electrode and a piezoelectric region between the first and second electrodes;
an insulating layer on the second electrode; and
an interconnection metal layer on the acoustic resonator, connected by a via to the first electrode or the second electrode and having a portion extending onto the insulating layer adjacent the via that serves as a first capacitor electrode of a capacitor disposed laterally adjacent the acoustic resonator and having a portion of the second electrode as a second capacitor electrode of the capacitor and a portion of the insulating layer between the first and second capacitor electrodes as a dielectric of the capacitor, wherein the first electrode is formed from a first conductive layer, wherein the second electrode is formed from second conductive layer, wherein the via connects the interconnection metal layer to a portion of the second conductive layer electrically connected to the first electrode and wherein the first capacitor electrode overlaps the portion of the second conductive layer electrically connected to the first electrode.

16. The device of claim 15, wherein the first electrode is formed from a first conductive layer, wherein the second electrode is formed from a second conductive layer, wherein the via connects the interconnection metal layer to the first conductive layer and wherein the first capacitor electrode overlaps a portion of the second conductive layer.

17. The device of claim 15, wherein the piezoelectric region is formed from a piezoelectric layer and wherein the via passes through the piezoelectric layer.

\* \* \* \* \*